(12) United States Patent
Griffin (10) Patent No.: US 7,629,847 B1
(45) Date of Patent: Dec. 8, 2009

(54) OPPOSING CURRENTS DIFFERENTIAL AMPLIFIER

(75) Inventor: Jed Griffin, Peyton, CO (US)

(73) Assignee: ATMEL Corporation, San Jose, CA (US)

(*) Notice: Subject to any disclaimer, the term of this patent is extended or adjusted under 35 U.S.C. 154(b) by 0 days.

(21) Appl. No.: 12/054,187

(22) Filed: Mar. 24, 2008

(51) Int. Cl.
*H03F 3/45* (2006.01)

(52) U.S. Cl. .................. 330/253; 330/257; 330/263

(58) Field of Classification Search .................. 330/253, 330/257, 263
See application file for complete search history.

(56) References Cited

U.S. PATENT DOCUMENTS

| | | | |
|---|---|---|---|
| 5,113,146 A | 5/1992 | De Jager et al. | |
| 6,140,876 A * | 10/2000 | Yero | 330/253 |
| 6,140,877 A | 10/2000 | Forbes | |
| 6,163,215 A * | 12/2000 | Shibata et al. | 330/254 |
| 6,411,132 B2 | 6/2002 | Griffin | |
| 6,825,721 B2 * | 11/2004 | Sanchez et al. | 330/253 |
| 6,856,197 B1 * | 2/2005 | Humphrey | 330/252 |
| 6,891,433 B2 * | 5/2005 | Schrader | 330/253 |
| 6,975,169 B2 | 12/2005 | Fifield et al. | |
| 7,061,322 B2 | 6/2006 | Heightley | |
| 7,167,052 B2 | 1/2007 | Heightley et al. | |
| 7,362,176 B2 * | 4/2008 | Carreto et al. | 330/267 |

* cited by examiner

*Primary Examiner*—Patricia Nguyen
(74) *Attorney, Agent, or Firm*—Fish & Richardson P.C.

(57) ABSTRACT

An opposing currents (OC) differential amplifier is disclosed that eliminates headroom constraints and other problems associated with conventional differential pair amplifiers with current source biasing. The OC differential amplifier has a higher differential gain and differential gain bandwidth than conventional differential pair amplifiers.

14 Claims, 6 Drawing Sheets

OPPOSING CURRENTS DIFFERENTIAL AMPLIFIER

TECHNICAL FIELD

This subject matter is generally related to electronic circuits.

BACKGROUND

A differential amplifier is an electronic circuit used to multiply the difference between two input voltages by a constant factor (e.g., the differential gain). A differential amplifier can be used, for example, in the construction of operational amplifiers (op-amps) and comparators. The input stage of a differential amplifier is commonly comprised of two transistors, referred to as a differential pair. The differential pair architecture has known limitations and design compromises. For example, the current source biasing of the differential pair can limit the functionality of the differential amplifier. If the large-signal bias current is set too high, the differential pair behaves as a virtual ground at the common node. The virtual ground at the common node negates the current steering capability of the differential pair. If the large-signal bias current is set too low, the maximum achievable differential gain is limited.

SUMMARY

An opposing currents (OC) differential amplifier is disclosed that eliminates headroom constraints and other problems associated with conventional differential pair amplifiers with current source biasing. The OC differential amplifier has a higher differential gain and differential gain bandwidth than conventional differential pair amplifiers.

DETAILED DESCRIPTION

Comparison with Differential Pair

Figure 1A:
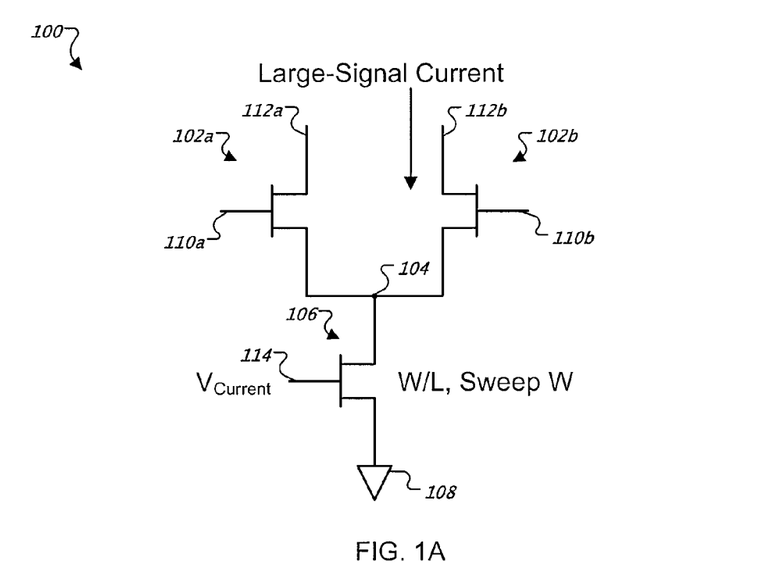
FIGS. 1A-1B illustrate an example of a conventional differential pair circuit and a graph of the effect that the large-signal current has upon the potential gain of the circuit.
Figure 1B:
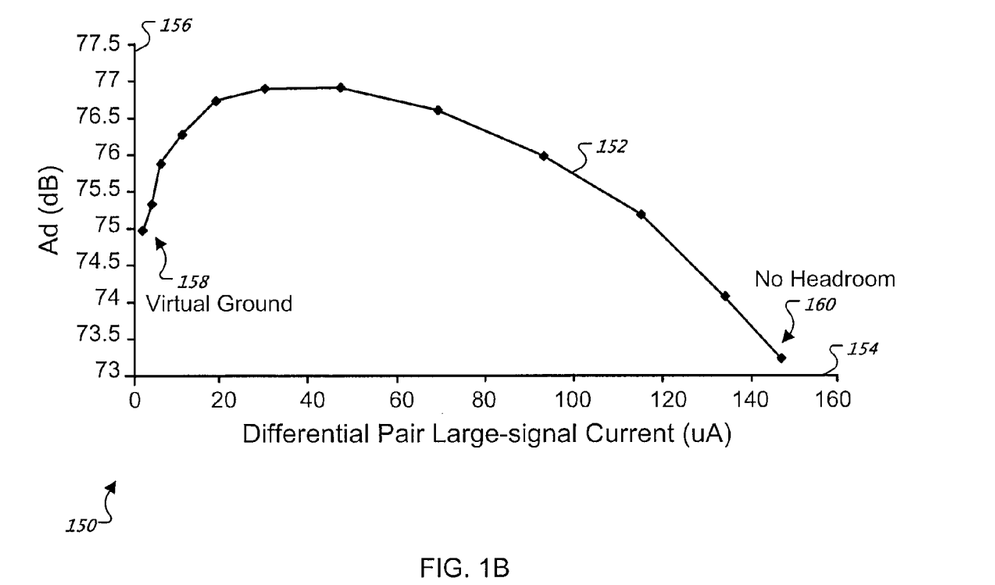

FIGS. 1A-1B illustrate an example of a conventional differential pair (DP) circuit 100 and a graph 150 of the effect that a large-signal current has upon the potential gain of the DP circuit 100. The DP circuit 100, for example, can be used to amplify differential inputs using a common mode of operation. In some examples, the DP circuit 100 can be built into a differential amplifier, operational amplifier (op-amp), comparator circuit or any other circuit that operates on differential signals.

The DP circuit 100 includes a differential set 102 comprised of a first transistor 102a and a second transistor 102b. The output nodes of the differential set 102 are connected at a common node 104. A current source transistor 106 is coupled between the common node 104 and a source 108. The current source transistor 106 is used to bias the current flowing through the differential set 102. A voltage applied to an input node 114 of the current source transistor 106 helps to determine a bias current, and is set to a value just above the threshold voltage to ensure that the current source transistor 106 remains in the saturation region.

When a large-signal current travels through the differential set 102, the differential gain as seen by dividing the voltage across 112a, 112b by the voltage across 110a, 110b, depends upon the selection of current source transistor 106. To illustrate, as shown in FIG. 1B, the graph 150 includes a DP differential gain plot 152 based upon an x-axis 154 large signal bias current value, plotted in terms of micro amps, versus a y-axis 156 differential gain, plotted in terms of decibels. To alter the bias current, the length of the current source transistor 106 is kept at a constant high value while sweeping the width. The graph 152 was generated by fixing a common mode at 110 optimally midway between the power rails and superimposing a small-signal sine wave in the low microvolts. The curvature of the DP differential gain plot 152 is similar to graphs generated from other operational common modes.

As is illustrated by a far left section 158 of the DP differential gain plot 152, if the large-signal bias current in the differential set 102 is set too high, the common node 104 behaves as a virtual ground. In this scenario, there is little or no differential amplification. Additionally, when the large-signal bias current is set high, there is limited current steering available. On the other hand, as the large-signal bias current in the differential set 102 shrinks lower, greater current steering can be achieved. Unfortunately, there is a simultaneous reduction in differential set 102 headroom and in differential gain, as can be viewed in a right hand section 160 of plot 152.

Effect of Common Node Voltage on Potential Gain

Figure 2A:
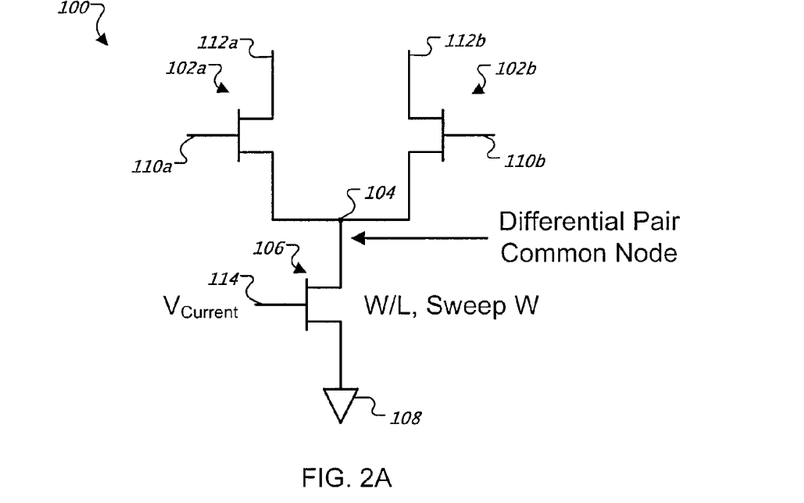
FIGS. 2A-2B illustrate an example of a conventional differential pair circuit and a graph of the effect that the common mode voltage has upon the potential gain of the circuit.
Figure 2B:
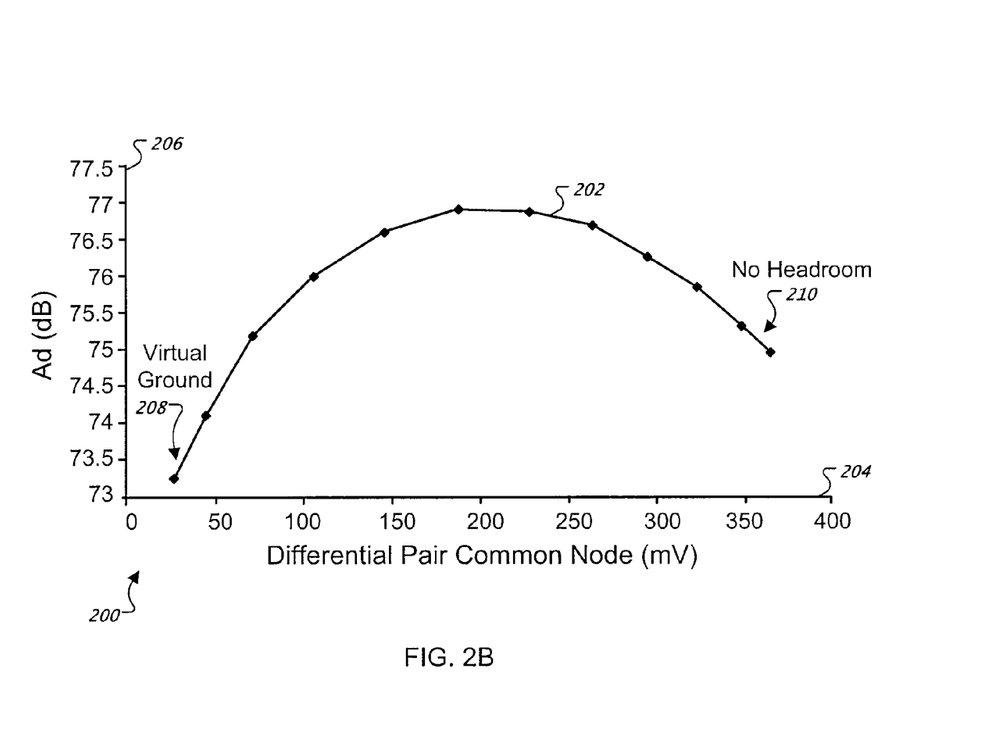

FIGS. 2A-2B illustrate an example of the DP circuit 100 (as described in FIG. 1A) and a graph 200 of the effect that the common node voltage has upon the potential gain of the circuit 100. As shown in FIG. 2A, the DP circuit 100 aids in illustrating the graph 200 (FIG. 2B) depicting a DP differential gain plot 202. The DP differential gain plot 202 is mapped to an x-axis 204 common node voltage, plotted in terms of milli Volts, versus a y-axis 206 differential gain, plotted in terms of decibels. The x-axis 204 voltage depicts the voltage as seen at the common node 104. As with FIG. 1B, to alter the common node voltage, the length of the current source transistor 106 is kept at a constant high value while sweeping the width. The graph 152 was generated by fixing a common mode at 110 optimally midway between the power rails and superimposing a small-signal sine wave in the low microvolts. The curvature of the DP differential gain plot 202 is similar to graphs generated from other operational common modes.

As is illustrated by a far left section 208 of the DP differential gain plot 202, a low common node voltage can cause the common node 104 to behave as a virtual ground. In this scenario, there is little or no differential amplification. Additionally, when the common node voltage is too low, there is limited current steering available. On the other hand, as the common node voltage increases, optimal current steering can be achieved. Unfortunately, there is a simultaneous reduction in 110 headroom and in differential gain, as can be viewed in a right hand section 210 of plot 200.

In reviewing both graph 152 (FIG. 1B) and graph 200, it is shown that in maximizing the headroom for differential gain as experienced by the common node 104 of the DP circuit 100, current steering is sacrificed, and vice-versa. In designing a DP circuit, high frequency and low power are mutually exclusive. At the optimal differential gain, the bias current may not be as high as desired. For a fixed common mode and as the current source decreases to optimally high differential gain, the large-signal current is limited by the headroom of the input transistors 102a, 102b of the differential set 102. This limits the potential gain bandwidth while the capacitance of the transistors 102a, 102b remains constant. As supply voltage is decreased, differential gain and gain bandwidth similarly suffers. The supply voltage can only be reduced as far as adequate gain bandwidth is still maintained (e.g., commonly greater than 1V). Even at higher supply voltage values, a larger gain bandwidth may be desirable than is achievable based upon the limitations of the DP circuit 100.

Effect of Removal of Gain Limitation

Figure 3:
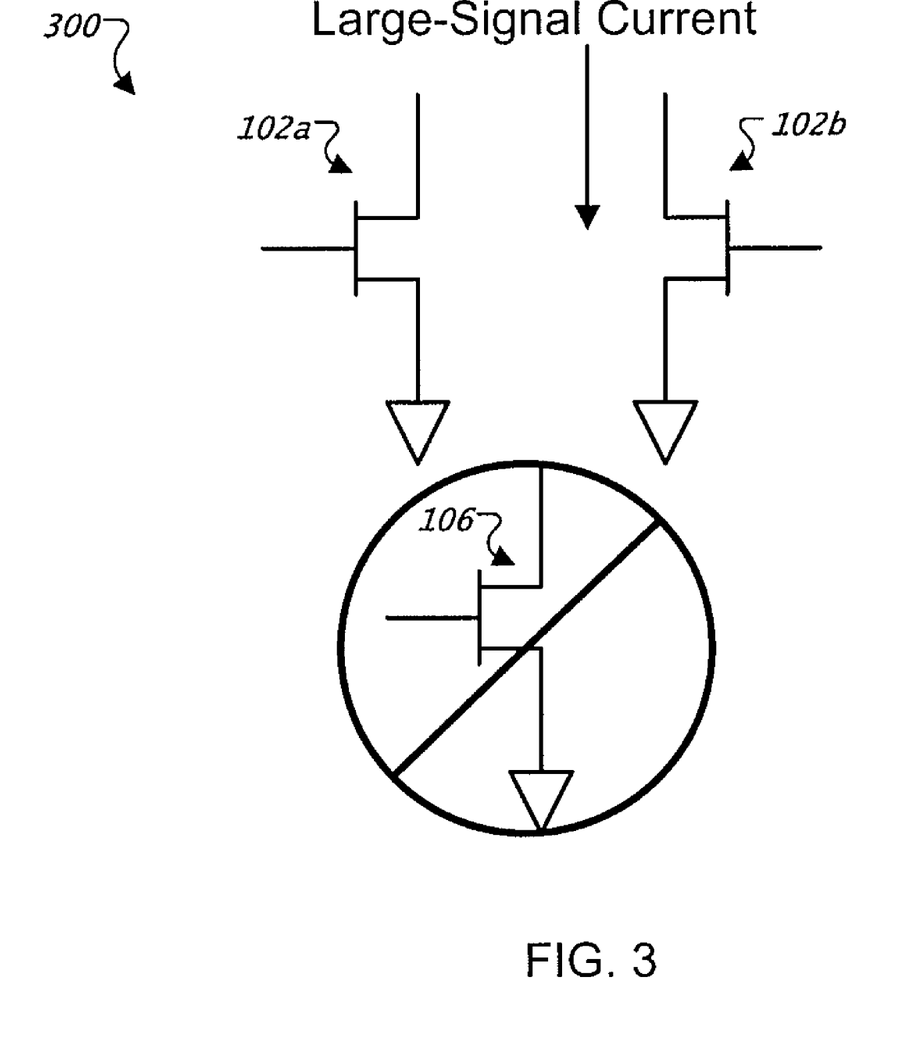
FIG. 3 illustrates an example of an opposing currents pair where only the common mode voltage sets the large-signal current, uninhibited by a current source that reduces the available headroom of the input transistors.

FIG. 3 illustrates an example of an opposing currents pair where only the common mode voltage sets the large-signal current, uninhibited by a current source 106 that reduces the available headroom of the input transistors 102a, 102b. By removing the current source transistor 106, the OC differential set 300 can perform free of the limitations imposed by the current source in differential pair configuration (as illustrated in the graphs 150, 200 of FIGS. 1B, 2B). The large-signal bias current of the OC differential set 300 is set by the common mode only, and unlike differential pair configurations is not unnecessarily inhibited by the reduced headroom from a current source.

Example Small Signals Model

Figure 4:
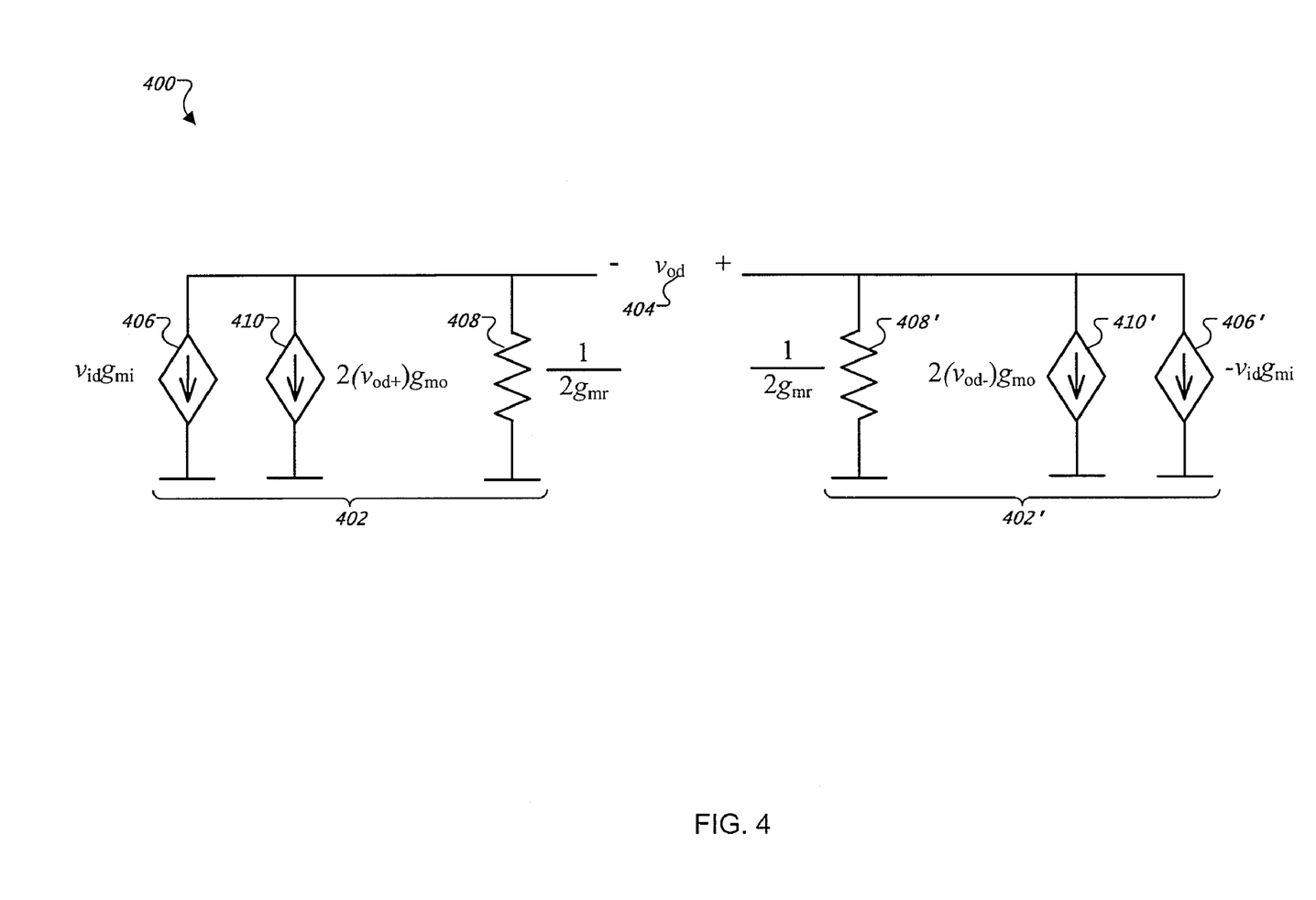
FIG. 4 illustrates an example small-signal model of an opposing currents differential amplifier.
Figure 5:
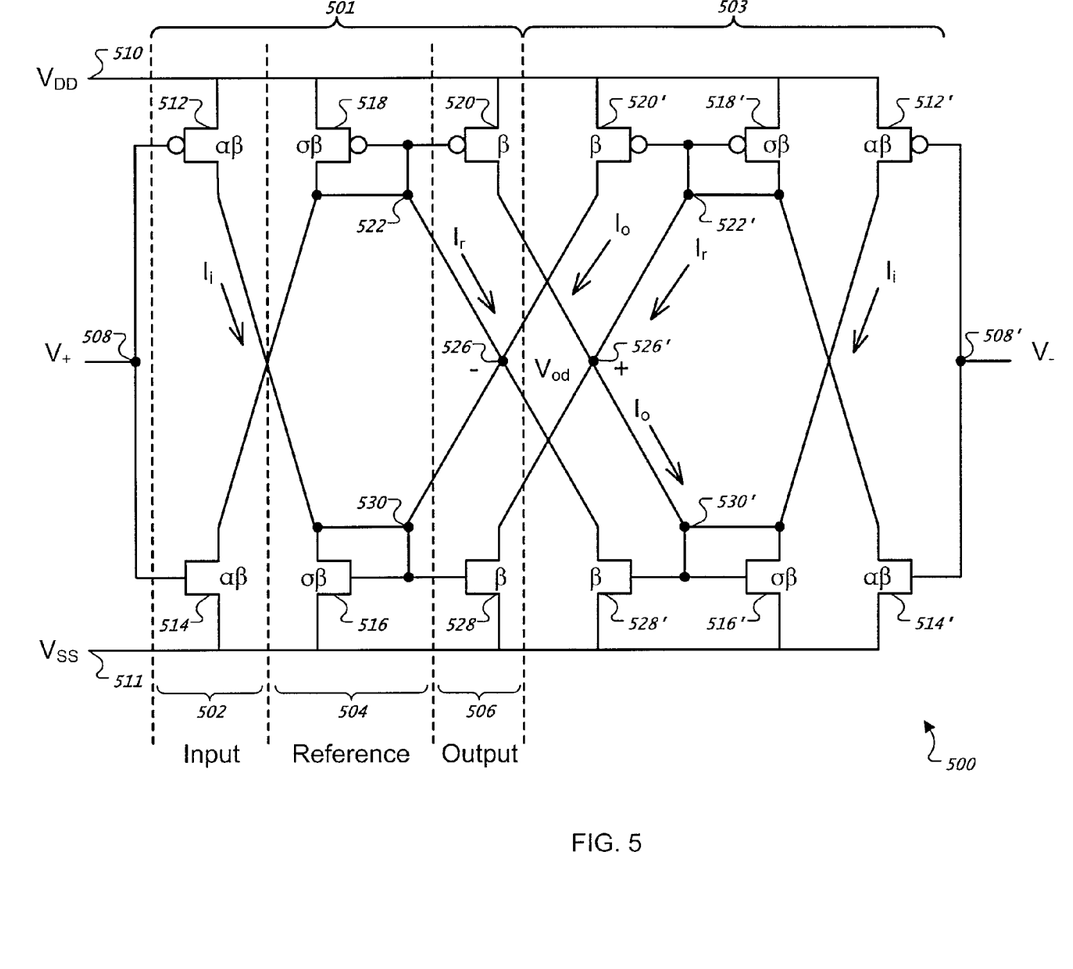
FIG. 5 illustrates an example circuit diagram of an opposing currents differential amplifier.

FIG. 4 illustrates an example small-signal model 400 of an OC differential amplifier circuit shown in FIG. 5. The small-signal model 400 takes into account the functionality of the OC differential amplifier circuit while running in saturation mode. The small-signal model 400 includes two mirrored halves, a non-inverting half 402 and an inverting half 402', positioned at either side of a small-signal voltage output $v_{od}$ 404. An input current source 406 associated with an input section of the OC differential amplifier circuit can be described by the following equation:

$$\pm v_{id} g_{mi},$$

where $v_{id}$ is the small-signal differential input voltage and $g_{mi}$ is the small-signal input transconductance. The input section includes two transistors in parallel and each transistor contributes one half the transconductance.

A reference resistor 408 represents the diode effect that a referencing section of the OC differential amplifier circuit has upon the small-signal model 400. The effect of the reference section can be described by the following equation:

$$\frac{1}{2g_{mr}}.$$

The reference resistor 408 describes a current mirror effect within the OC differential amplifier circuit, where $g_{mr}$ is a small-signal transconductance associated with the reference section. Two transistors in parallel contribute to the current mirroring, resulting in a doubling of the inverse transconductance.

The contribution of an output current source 410 associated with an output section of the OC differential amplifier circuit is described by the following equation:

$$2(v_{od+/-})g_{mo},$$

where $g_{mo}$ is a small-signal transconductance associated with the output section of the OC differential amplifier circuit and $v_{od+/-}$ is a small-signal differential output voltage. Note that the output current source equates to the output section of the OC differential amplifier circuit which includes two transistors in parallel.

Solving for differential gain, the small-signal gain calculation reduces to:

$$A_d = \frac{g_{mi}}{g_{mr} - g_{mo}}.$$

By applying input signals of opposing amplitudes to the OC differential amplifier circuit, the amplified outputs have the same orientation. The maximum gain and the gain bandwidth achievable by the OC differential amplifier circuit is greater than that which is presently achieved using differential pair amplification.

Example Circuitry for Opposing Currents Differential Amplifier

FIG. 5 illustrates an example circuit diagram of an OC differential amplifier circuit 500. The OC differential amplifier circuit 500, for example, can be constructed using metal oxide semiconductor field effect transistors (MOSFET). The OC differential amplifier circuit 500 can be created using standard manufacturing processes. The layout of the OC differential amplifier circuit is roughly comparable to the footprint required to create a differential pair amplifier.

For purposes of description, the OC differential amplifier circuit 500 can be split into non-inverting and inverting circuit arrangements 501 and 503. Each of the circuit arrangements 501, 503 can have three sections: an input section 502, a reference section 504, and an output section 506. The non-inverting circuit arrangement 503 is a mirror image of the inverting circuit arrangement 501. Thus the circuit 500 will be described with respect to the non-inverting circuit arrangement 501 with the understanding that the inverting circuit arrangement 503 can be similarly described.

Referring now to the non-inverting circuit arrangement 501 (e.g., left side of circuit 500) of the circuit diagram, a first voltage applied to a non-inverting differential input node 508 can be described by the following equation:

$$V_+ = V_{ic} + \frac{v_{id}}{2}.$$

In this equation, half of the small-signal input differential voltage $v_{id}$ is added to the common mode input voltage $V_{ic}$. Similarly, a second voltage applied to an inverting differential input node 508' (right side of circuit 500) can be described by the following equation:

$$V_- = V_{ic} - \frac{v_{id}}{2}.$$

In this equation, half of the small-signal input differential voltage $v_{id}$ is subtracted from the common mode input voltage $V_{ic}$. The first voltage $V_+$ and the second voltage V have opposing amplitudes. The amplified outputs voltages $V_{od+/-}$ have the same orientation due to the opposing currents of the OC differential amplifier circuit 500.

An input section 502 can include a p-channel MOSFET (p-MOSFET), non-inverting input transistor 512, a p-MOSFET, inverting input transistor 512', an n-channel MOSFET (n-MOSFET), non-inverting input transistor 514, and an n-MOSFET, inverting input transistor 514'. These MOSFET transistors arrange to utilize the full input voltage from the differential input nodes 508, 508' for complete bias at the input section 502. Thus no artificial headroom limitations are imposed upon the input transistors 512, 512', 514, 514' associated with conventional differential pair amplifiers. More current per transistor capacitance in circuit 500 allows a higher frequency response and thus higher gain bandwidth.

The p-MOSFET input transistors 512, 512' can be referenced to a first supply rail, $V_{DD}$ 510. The n-MOSFET input transistors 514, 514' can be referenced to a second supply rail, $V_{SS}$ 511. The p-MOSFET input transistors 512, 512' and the n-MOSFET input transistors 514, 514' can each have a gain value of $\alpha\beta$, where $\alpha$ represents a scaling factor applied to the $$\frac{W}{L}$$

ratio of the MOSFET transistor, where W is transistor gate width and L is transistor gate length.

Referring to the reference section 504 of the non-inverting circuit arrangement 510, the drain of the p-MOSFET, non-inverting input transistor 512 is coupled to the drain of the n-MOSFET, non-inverting reference transistor 516. The input current $I_i$, traveling along this connection, can be described by the following equation:

$$I_i = \frac{\alpha\beta}{2}(V_{ic} - V_T)^2.$$

The drain of the n-MOSFET, non-inverting input transistor 514 is coupled to the drain of the p-MOSFET, non-inverting reference transistor 518. The non-inverting reference transistors 516, 518 can each have a gain value of $\sigma\beta$, where $\sigma$ is a scaling factor applied to the $$\frac{W}{L}$$

ratio of the transistor. Some example values for these scalars can be $\alpha=3$ and $\sigma=1$. Other values are possible. The values assigned to $\alpha$ and $\sigma$ effect the common mode input range. The selection of the common mode input range can determine maximum gain for the opposing currents circuit.

In some implementations, the reference section 504 applies level-shifting and stabilizes amplification. The reference section 504 can also maintain the voltage level near the center point. The gate and the drain of the p-MOSFET, non-inverting reference transistor 518 can be coupled together, and the gate of the p-MOSFET, non-inverting reference transistor 518 can also be coupled to the gate of a p-MOSFET, non-inverting output transistor 520. A non-inverting, p-MOSFET current mirror node 522 is coupled to an n-MOSFET, inverting output transistor 528' in the inverting circuit arrangement 503. A reference current $I_r$ flows along this path. The reference current $I_r$ can be described by the following equation:

$$I_r = \frac{\beta}{2}[\sigma(V_{od+/-} - V_T)^2 - \sigma(V_{ic} - V_T)^2],$$

where $V_{od+/-}$ refers to the voltage as seen at a positive gain output node 526' minus a negative gain output node 526. The gate and drain of the n-MOSFET, non-inverting reference transistor 516 are similarly coupled together, and the gate of the n-MOSFET, non-inverting reference transistor 516 is coupled to the gate of an n-MOSFET, non-inverting output transistor 528. A non-inverting n-MOSFET, current mirror node 530 is coupled to a drain of a p-MOSFET, inverting output transistor 520'. An output current $I_o$ flows along this path. The output current $I_o$ can be described by the following equation:

$$I_o = \frac{\beta}{2}[(V_{od+/-} - V_T)^2.$$

The coupling of the n-MOSFET current mirror node 530 to the p-MOSFET, inverting output transistor 520' and the coupling of the p-MOSFET current mirror node 522 to the n-MOSFET, inverting output transistor (528') are joined at the inverting output node 526. The non-inverting output transistors 520, 528, along with the inverting output transistors 520', 528', each have a gain $\beta$. The equation for the voltage as referenced at one of the output nodes 526 is as follows:

$$V_{od+/-} \approx V_T + \left(\frac{\alpha}{\sigma-1}\right)^{\frac{1}{2}}(V_{ic} - V_T),$$

where $V_T$ is a transistor threshold voltage, a $V_{ic}$ is a common mode input voltage.

Within the output section 506, a current mirroring provided by the current mirror nodes 522, 530 inverts the opposite current such that the two currents amplify into the load. The inverting (e.g., right) half of the circuit is designed in a similar manner.

Comparison of Differential Gains and Gain Bandwidths

Figure 6:
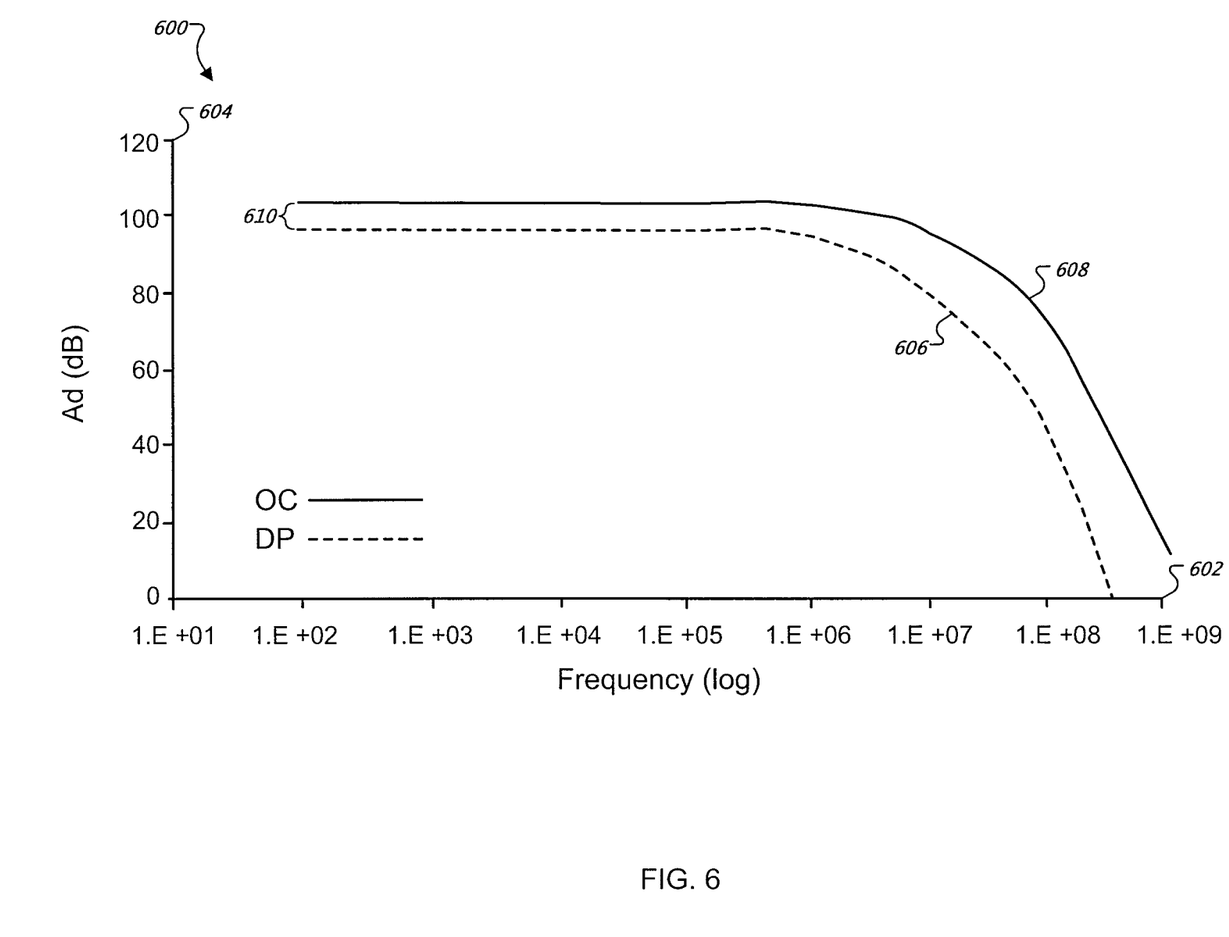
FIG. 6 illustrates a graphical comparison of differential gains and gain bandwidths as realized by differential pair circuits versus opposing currents circuits.

FIG. 6 illustrates a graph 600 comparing the differential gains and gain bandwidths as realized by conventional DP amplifier circuits versus OC differential amplifier circuits. A DP trace 606, plotted against an x-axis 602 of frequency (measured in logarithmic units) and a y-axis 604 of gain (measured in decibels), illustrates the gain realized by a typical DP amplifier circuit sized for optimal gain. The graph 600 is based upon an input voltage of about 1.3 Volts. An OC trace 608 extends above and beyond the DP trace 606, illustrating the higher cutoff frequency (higher gain bandwidth) and higher gain of the OC differential amplifier circuit. Table I provides some comparison values at discrete points of the graph 600:

TABLE I

Example Gain and Gain Bandwidth Data

|  | OC | DP |
|---|---|---|
| Gain | 103 dB | 96 dB |
| Gain Bandwidth (−3 dB) | 5 MHz | 1 MHz |
| Unity Gain Bandwidth | 1 GHz | 100 MHz |

As shown in the Table I by a gap 610 between the two plots 606, 608, not only does the OC differential amplifier circuit provide more gain than the comparable DP amplifier circuit, but there is more gain bandwidth available using the OC differential amplifier circuit. As the power supply voltage decreases, the gap 610 widens. The OC differential amplifier circuit demonstrates a higher differential gain and a higher gain bandwidth regardless of the speed to gain tradeoff.

The common mode rejection ratio (CMRR) likewise reflects the difference in differential gain. Other OC differential amplifier circuit performance measures, such as the power supply rejection ratio (PSRR) and input common mode range (ICMR) are comparable to or exceed the performance of DP amplifier circuits, using equally sized transistors. Because the OC differential amplifier circuit lacks headroom limitations beyond the threshold voltage of the input transistors, the common mode can swing to a wider voltage range than convention DP amplifier circuits. This suggests that the ICMR of the OC differential amplifier circuit should exceed the performance of DP amplifier circuits.

Other advantages provided by the symmetric design of the OC differential amplifier circuit include a reduction of total harmonic distortion, more centered level shifting (e.g., due to the reference section 504 described in FIG. 5) and a wider signal swing across frequency.

A number of implementations have been described. Nevertheless, it will be understood that various modifications may be made. For example, individual elements within the described circuitry may be combined, deleted, modified, or supplemented to provide further functionality. In addition, the circuitry described may be constructed of other materials or types of electronic elements while still achieving the desirable results. Accordingly, other implementations are within the scope of the following claims.

What is claimed is:

1. An opposing current (OC) differential amplifier circuit, comprising:
   a non-inverting circuit arrangement including:
      a first input section including a non-inverting input node operable to utilize a full input voltage;
      a first reference section coupled to the first input section and operable to apply level shifting and stabilized amplification;
      a first output section coupled to the first reference section and operable to amplify a first current into a load;
   an inverting circuit arrangement coupled to the non-inverting circuit arrangement and including:
      a second input section including a non-inverting input node operable to utilize a full input voltage;
      a second reference section coupled to the second input section and operable to apply level shifting and stabilized amplification; and
      a second output section coupled to the second reference section and operable to amplify a second current into a load,
   wherein the non-inverting and inverting circuit arrangements are operable to provide a small-signal differential gain of the OC differential amplifier circuit that is a function of transconductance of the input, reference and output sections.

2. The circuit of claim 1, wherein the input sections include input transistors and a headroom of the OC differential amplifier circuit is limited to threshold voltages of the input transistors.

3. The circuit of claim 2, wherein the input transistors are metal oxide semiconductor field effect transistors (MOSFET).

4. The circuit of claim 3, where the output sections include level shifters and a current mirror of p-MOSFET transistors.

5. The circuit of claim 3, wherein an input offset voltage of the OC differential amplifier circuit is proportional to a gain of the input sections and inversely proportional to transistor sizes.

6. The circuit of claim 1, where the small-signal differential gain is given by $$A_d = \frac{g_{mi}}{g_{mr} - g_{mo}},$$

where $g_{mi}$ is a small-signal transconductance associated with the input sections, $g_{mr}$ is a small-signal transconductance associated with the reference sections, and $g_{mo}$ is a small-signal transconductance associated with the output sections.

7. The circuit of claim 6, where a small-signal effect of the input sections is given by $\pm v_{id} g_{mi}$, where $v_{id}$ is a small-signal differential input voltage.

8. The circuit of claim 6, where a small-signal effect of the reference sections is given by $$\frac{1}{2 g_{mr}}.$$

9. The circuit of claim 6, where a small-signal effect of the output sections is given by $2(v_{od+/-}) g_{mo}$, where $v_{od}$ is a small-signal differential output voltage.

10. The circuit of claim 1, where differential output nodes of the output sections are referenced at a voltage given by $$V_{od+/-} \approx V_T + \left(\frac{\alpha}{\sigma - 1}\right)^{\frac{1}{2}} (V_{ic} - V_T),$$

where $\alpha$ and $\sigma$ are scaling factors, $V_T$ is a transistor threshold voltage, $V_{ic}$ is a common mode input voltage and $V_{od+/-}$ is a differential output voltage as seen at the differential output nodes.

11. The circuit of claim 1, wherein the first or second circuit arrangement further comprises:
   a first transistor and a second transistor, the first and second transistors referenced to a first supply rail; and
   a third transistor and a fourth transistor, the third and fourth transistors referenced to a second supply rail, a drain of the third transistor coupled to a drain of the second transistor, and a drain of the fourth transistor coupled to a drain of the first transistor.

12. The circuit of claim 11, further comprising:
a first reference transistor referenced to the first supply rail and having a gate coupled to respective drains of the second and third transistors and to a gate of the second transistor; and
a second reference transistor referenced to the second supply rail and having a gate coupled to respective drains of the first and fourth transistors and to a gate of the fourth transistor.

13. The circuit of claim 11, wherein the first and third transistors have gain values given by a product of $\alpha\beta$, where $\beta$ is a gain of the transistors and $\alpha$ represents a scaling factor applied to ratio $$\frac{W}{L}$$

of a transistor, where W is gate width and L is gate length of the transistor.

14. The circuit of claim 11, wherein the second and fourth transistors have gain values given by a product of $\sigma\beta$, where $\beta$ is a gain of the transistors and $\sigma$ represents a scaling factor applied to ratio $$\frac{W}{L}$$

of a transistor, where W is gate width and L is gate length of the transistor.

* * * * *